US012588418B2

(12) United States Patent　　(10) Patent No.:　US 12,588,418 B2
Kishimoto et al.　　　　　　　　(45) Date of Patent:　　Mar. 24, 2026

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 889 days.

(21) Appl. No.: 17/883,739

(22) Filed: Aug. 9, 2022

(65) Prior Publication Data

US 2022/0384707 A1　　Dec. 1, 2022

Related U.S. Application Data

(63) Continuation of application No. PCT/JP2021/005469, filed on Feb. 15, 2021.

(30) Foreign Application Priority Data

Feb. 19, 2020　(JP) ................................. 2020-026522

(51) Int. Cl.
　　*H10N 30/00*　　(2023.01)
　　*H10N 30/50*　　(2023.01)
　　*H10N 30/87*　　(2023.01)

(52) U.S. Cl.
　　CPC ........... *H10N 30/50* (2023.02); *H10N 30/871* (2023.02)

(58) Field of Classification Search
　　CPC .... H10N 30/50; H10N 30/871; H10N 30/073; H10N 30/2047
　　See application file for complete search history.

(56) References Cited

U.S. PATENT DOCUMENTS

2014/0028760 A1* 1/2014 Sameshima ............ H10N 30/87
　　　　　　　　　　　　　　　　　310/330

FOREIGN PATENT DOCUMENTS

| JP | H08162686 A | | 6/1996 |
| JP | 2005236338 A | * | 9/2005 |
| JP | 2008054367 A | | 3/2008 |
| JP | 2018069654 A | * | 5/2018 |
| JP | 2019114979 A | | 7/2019 |

(Continued)

OTHER PUBLICATIONS

Official Communication issued in corresponding Chinese Patent Application No. 202180014365.8, mailed on Jun. 12, 2025, 6 pages.

(Continued)

*Primary Examiner* — Julio C. Gonzalez

(74) *Attorney, Agent, or Firm* — Keating & Bennett, LLP

(57) ABSTRACT

In a piezoelectric device, when viewed in a direction perpendicular to one main surface, an outer shape of a recess is a polygonal shape or a circular shape. When n represents a number of sides of the polygonal shape, r represents a radius of a circumscribed circle of an imaginary regular polygon including n sides with a length identical to a length of a shortest of the sides, and d represents a maximum thickness of a membrane portion, which is located above the recess, of a multilayer portion, $r \le 197.7 \, dn^{-0.6698}$ when $3 \le n \le 7$, and $r \le 52.69 \, d$ when $8 \le n$ or when the outer shape of the recess is a circular shape.

20 Claims, 11 Drawing Sheets

(56) References Cited

FOREIGN PATENT DOCUMENTS

WO          2012144305  A1     10/2012

OTHER PUBLICATIONS

International Search Report in PCT/JP2021/005469, mailed May 11, 2021, 3 pages.
Written Opinion in PCT/JP2021/005469, mailed May 11, 2021, 3 pages.
Tai et al., "Single crystal FBAR with LiNbO3 and LiTaO3," Proceedings of the Symposium on Ultrasonic Electronics, 2007, vol. 28, pp. 151-152.

* cited by examiner

FIG.3
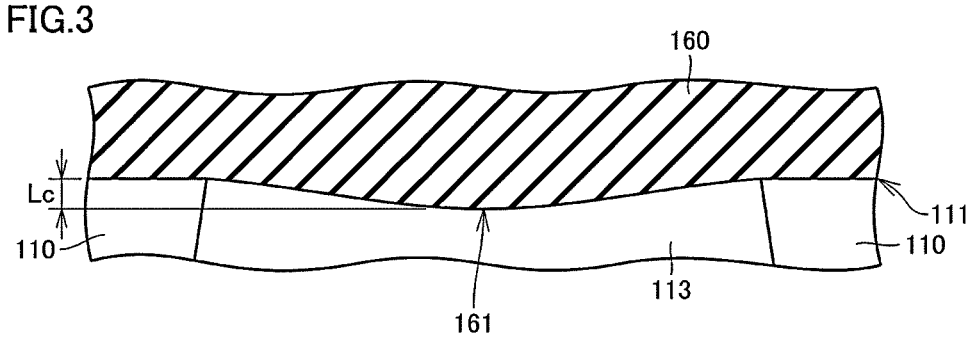
FIG.4
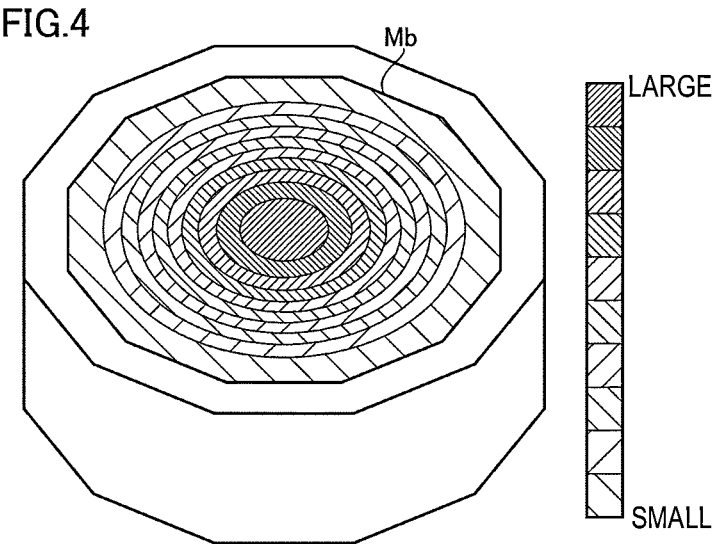
FIG.5
AMOUNT OF
DEFORMATION OF
MEMBRANE PORTION
($\mu$m)
DEPTH OF RECESS ($\mu$m)

AMOUNT OF
DEFORMATION OF
MEMBRANE PORTION
($\mu$m)

PRESSURE INSIDE
RECESS (Pa)

LARGE DEFORMATION

MEDIUM
DEFORMATION

SMALL
DEFORMATION

LENGTH OF
VERTICAL SIDE OF
RECTANGULAR
MEMBRANE
PORTION (μm)

LENGTH OF HORIZONTAL SIDE OF
RECTANGULAR MEMBRANE PORTION (μm)

SLOPE a OF
APPROXIMATION
STRAIGHT LINE $Lc (r=197.7n^{-0.6698})$

PLURAL NUMBER OF SIDES n
MAKING UP POLYGONAL SHAPE

130

150

130

150
160

130

150
160

PIEZOELECTRIC DEVICE

CROSS REFERENCE TO RELATED APPLICATIONS

This application claims the benefit of priority to Japanese Patent Application No. 2020-026522 filed on Feb. 19, 2020 and is a Continuation Application of PCT Application No. PCT/JP2021/005469 filed on Feb. 15, 2021. The entire contents of each application are hereby incorporated herein by reference.

BACKGROUND OF THE INVENTION

1. Field of the Invention

The present invention relates to piezoelectric devices.

2. Description of the Related Art

"Single crystal FBAR with LiNbO3 and LiTaO3," Proceedings of the Symposium on Ultrasonic Electronics, Vol. 28, (2007), pp. 151-152 is an example of a prior art document disclosing the configuration of a piezoelectric device. In the piezoelectric device described in "Single crystal FBAR with LiNbO3 and LiTaO3", Proceedings of the Symposium on Ultrasonic Electronics, Vol. 28, (2007), pp. 151-152, a space is formed below a piezoelectric layer sandwiched between electrodes.

SUMMARY OF THE INVENTION

In a configuration in which a space is formed below a piezoelectric layer, the characteristics of the piezoelectric device may be degraded due to the piezoelectric layer curving downwards or the thickness of the piezoelectric layer being non-uniform.

Preferred embodiments of the present invention provide piezoelectric devices that each reduce or prevent degradation of characteristics caused by curving of a piezoelectric layer or non-uniformity of a thickness of the piezoelectric layer.

A piezoelectric device according to a preferred embodiment of the present invention includes a base portion and a multilayer portion. The base portion includes one main surface and another main surface located on an opposite side from the one main surface, and has a recess in the one main surface. A multilayer portion is stacked on a side of the base portion where the one main surface is located so as to cover the recess from above. The multilayer portion includes, at least above the recess, a single-crystal piezoelectric layer and a pair of electrode layers. A voltage is applied to the single-crystal piezoelectric layer via the pair of electrode layers. An outer shape of the recess is a polygonal shape or a circular shape when viewed in a direction perpendicular to the one main surface. When n represents a number of a plurality of sides of the polygonal shape, r represents a radius of a circumscribed circle of an imaginary regular polygon including n sides with a length identical to a length of a shortest side among the plurality of sides, and d represents a maximum thickness of a membrane portion, which is located above the recess, of the multilayer portion, $r \leq 197.7 \, dn^{-0.6698}$ is satisfied when $3 \leq n \leq 7$, and $r \leq 52.69 \, d$ is satisfied when $8 \leq n$ or when the outer shape of the recess is a circular shape.

According to preferred embodiments of the present invention, degradation of the characteristics of a piezoelectric device caused by curvature of a piezoelectric layer or non-uniformity of the thickness of the piezoelectric layer is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a partial enlarged view of a portion III of the cross-sectional view of the piezoelectric device illustrated in FIG. 2.

FIG. 4 is a diagram illustrating the results of simulation analysis of the distribution of the amount of deformation in a membrane portion having regular polygonal shape.

FIG. 5 is a graph illustrating the results of simulation analysis of the relationship between the depth of a recess and the amount of deformation of a membrane portion having a circular shape.

DETAILED DESCRIPTION OF THE PREFERRED EMBODIMENTS

Figure 1:
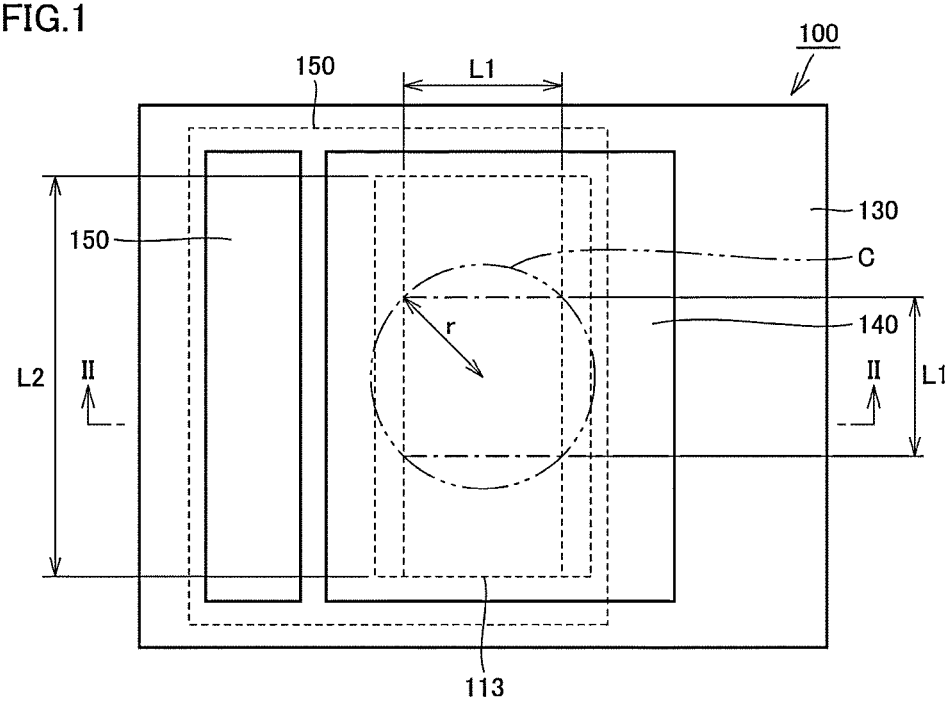
FIG. 1 is a plan view illustrating the configuration of a piezoelectric device according to Preferred Embodiment 1 of the present invention.

Hereafter, piezoelectric devices of preferred embodiments of the present invention are described while referring to the drawings. In the following description of the preferred embodiments, identical or equivalent elements or features in the drawings are denoted by the same symbols and description thereof is not repeated.

Preferred Embodiment 1

Figure 2:
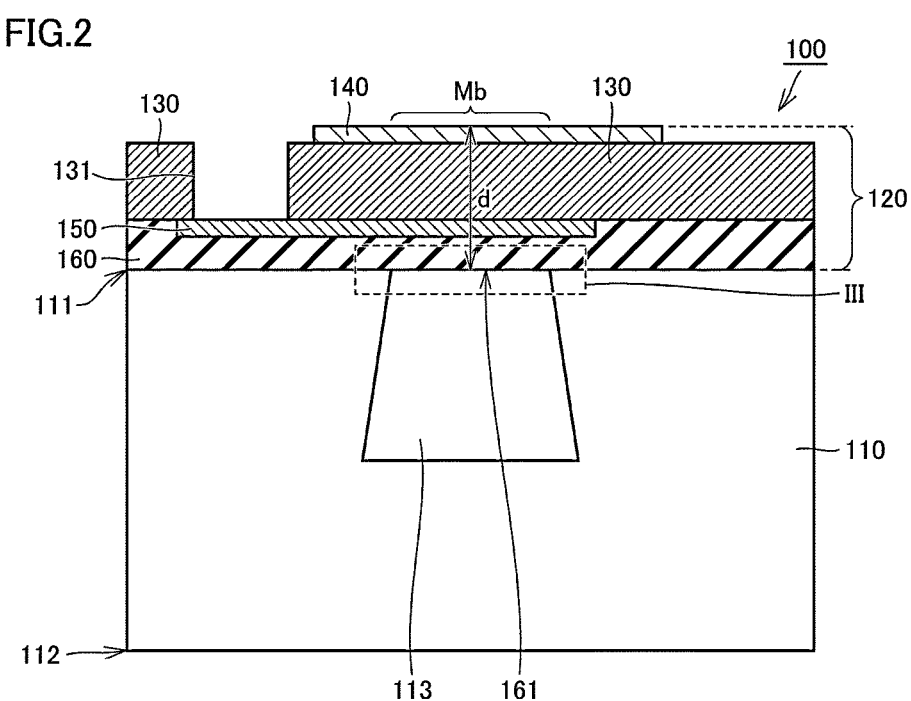
FIG. 2 is a cross-sectional view of the piezoelectric device illustrated in FIG. 1 viewed in the direction of the arrows of line II-II.

FIG. 1 is a plan view illustrating the configuration of a piezoelectric device according to Preferred Embodiment 1 of the present invention. FIG. 2 is a cross-sectional view of the piezoelectric device illustrated in FIG. 1 viewed in the direction of the arrows of line II-II. FIG. 3 is a partial enlarged view of a part III in the cross-sectional view of the piezoelectric device illustrated in FIG. 2. In FIG. 1, the internal configuration of the piezoelectric device is illustrated using dotted lines.

As illustrated in FIGS. 1 and 2, a piezoelectric device 100 according to Preferred Embodiment 1 of the present invention includes a base portion 110 and a multilayer portion 120.

The base portion 110 has one main surface 111 and another main surface 112 located on the opposite side from the one main surface 111. The base portion 110 has a recess 113 formed in the one main surface 111.

In this preferred embodiment, the width of an opening of the recess 113 located on the side near the one main surface 111 is smaller than the width of a bottom portion of the recess 113. In the recess 113, the width of the opening may be equal to the width of the bottom portion or the width of the opening may be larger than the width of the bottom portion. Hereinafter, the region located above the opening of the recess 113 may be referred to as above the recess 113.

As illustrated in FIG. 2, the recess 113 is covered from above by the multilayer portion 120 stacked on the one main surface 111 side of the base portion 110. In this preferred embodiment, the inside of the recess 113 is a sealed space.

In the piezoelectric device 100 according to this preferred embodiment, the pressure inside the recess 113 is a negative pressure. The pressure inside the recess 113 may be atmospheric pressure or a positive pressure.

In this preferred embodiment, the base portion 110 includes Si. However, the material of the base portion 110 is not limited to Si.

The multilayer portion 120 includes a single-crystal piezoelectric layer 130 and a pair of electrode layers. A voltage is applied to the single-crystal piezoelectric layer 130 via the pair of electrode layers. In this preferred embodiment, the pair of electrode layers include an upper electrode layer 140 and a lower electrode layer 150. The multilayer portion 120 further includes an intermediate layer 160.

The single-crystal piezoelectric layer 130 is located above the base portion 110. The single-crystal piezoelectric layer 130 is disposed such that at least a portion of the single-crystal piezoelectric layer 130 is located above the recess 113. The single-crystal piezoelectric layer 130 curves in a convex manner towards the base portion 110 in the region located above the recess 113. The single-crystal piezoelectric layer 130 is flat in the regions not located above the recess 113.

The single-crystal piezoelectric layer 130 includes a hole 131 that penetrates vertically through the single-crystal piezoelectric layer 130. In this preferred embodiment, the hole 131 is located above the one main surface 111 of the base portion 110 and not above the recess 113.

The single-crystal piezoelectric layer 130 includes lithium tantalate or lithium niobate. The single-crystal piezoelectric layer 130 including lithium tantalate or lithium niobate has a uniform polarization state.

The upper electrode layer 140 is disposed above the single-crystal piezoelectric layer 130. The upper electrode layer 140 is disposed so that at least a portion of the upper electrode layer 140 is located above the recess 113.

In this preferred embodiment, the upper electrode layer 140 is disposed above a portion of the single-crystal piezoelectric layer 130. An adhesive layer including Ti or the like may be disposed between the upper electrode layer 140 and the single-crystal piezoelectric layer 130.

The lower electrode layer 150 is disposed to face at least a portion of the upper electrode layer 140 across the single-crystal piezoelectric layer 130. The lower electrode layer 150 is disposed such that at least a portion of the lower electrode layer 150 is located above the recess 113. The lower electrode layer 150 is disposed above the recess 113 so as to face at least a portion of the upper electrode layer 140 across the single-crystal piezoelectric layer 130.

A portion of the lower electrode layer 150 is disposed so as to be located below the hole 131 in the single-crystal piezoelectric layer 130. In this preferred embodiment, the lower electrode layer 150 is formed so as to cover the hole 131 in the single-crystal piezoelectric layer 130 from below. Lead-out wiring connected to the top of the lower electrode layer 150 may be formed inside the hole 131.

The lower electrode layer 150 may be formed so as to cover the hole 131 of the single-crystal piezoelectric layer 130 from below via an adhesive layer. The material of the adhesive layer is not particularly limited as long as the material exhibits conductivity and adhesiveness. The adhesive layer includes Ti, Cr, Ni or NiCr, for example.

The intermediate layer 160 is stacked so as to cover the lower electrode layer 150 from below. In this preferred embodiment, the intermediate layer 160 is provided so as to be in contact with the lower surface of the lower electrode layer 150 and the portions of the lower surface of the single-crystal piezoelectric layer 130 that are not covered by the lower electrode layer 150. As illustrated in FIGS. 2 and 3, a lower surface 161 of the intermediate layer 160 is connected to the one main surface 111 of the base portion 110.

In this preferred embodiment, the multilayer portion 120 curves in a convex manner towards the other main surface 112 above the recess 113. As illustrated in FIG. 3, the lower surface 161 of the intermediate layer 160 located above the recess 113 curves in a convex manner towards the other main surface 112. In the regions not located above the recess 113, the lower surface 161 of the intermediate layer 160 is flat. Lc denotes the difference in height between the region of the lower surface 161 of the intermediate layer 160 above the recess 113 and the regions of the lower surface 161 of the intermediate layer 160 not above the recess 113.

As illustrated in FIGS. 2 and 3, the intermediate layer 160 and the base portion 110 are directly connected to each other in the regions not located above the recess 113. However, the intermediate layer 160 and the base portion 110 do not have to be directly connected to each other. The intermediate layer 160 and the base portion 110 may be connected to each other via a metal layer.

In this preferred embodiment, the intermediate layer 160 includes $SiO_2$. The material of the intermediate layer 160 is not limited to $SiO_2$ and the material of the intermediate layer 160 is acceptable as long as the material is an insulating material. For example, the intermediate layer 160 may include an organic material having electrically insulating and thermally insulating properties.

Thus, in this preferred embodiment, the multilayer portion 120 includes, at least above the recess 113, the single-crystal piezoelectric layer 130, the upper electrode layer 140, the lower electrode layer 150, and the intermediate layer 160.

In this preferred embodiment, the outer shape of the recess 113 is rectangular when viewed in a direction perpendicular to the one main surface 111. Among the edges defining the rectangular shape, L1 denotes the length of the short edges and L2 denotes the length of the long edges. However, the outer shape of the recess 113 is not limited to being a rectangular shape and may instead be a polygonal shape other than a rectangular shape or a circular shape when viewed in a direction perpendicular to the one main surface 111.

As illustrated in FIG. 1, looking in a direction perpendicular to the one main surface 111, when n represents the number of a plurality of sides of the polygonal shape defining the outer shape of the recess 113, r represents the radius of a circumscribed circle C of an imaginary regular polygonal shape including n sides having the length L1 identical to the length of the shortest side among the plurality of sides, and d represents the maximum thickness of a membrane portion Mb, which is located above the recess 113, of the multilayer portion 120, $r \leq 197.7 \ dn^{-0.6698}$ is satisfied when $3 \leq n \leq 7$ and $r \leq 52.69 \ d$ is satisfied when $8 \leq n$ or when the outer shape of the recess 113 is circular.

In this preferred embodiment, since n=4, $r \leq 197.7 \times d \times 4 - 0.6698 = 78.1 \ d$ is satisfied.

In this preferred embodiment, the maximum thickness d of the membrane portion Mb is the maximum thickness between the upper surface of the upper electrode layer 140 and the lower surface 161 of the intermediate layer 160 in a direction perpendicular to the one main surface 111 in the part located above the recess 113.

Hereafter, simulation results obtained by calculating the relationship between the radius r of the above circumscribed circle C and the maximum thickness d of the membrane portion Mb are described. As example simulation analysis conditions, the base portion 110 includes Si and the single-crystal piezoelectric layer 130 includes lithium niobate. The amount of deformation due to curving of the membrane portion Mb was calculated using the finite element method (FEM).

FIG. 4 is a diagram illustrating the results of simulation analysis of a distribution of the amount of deformation in a membrane portion having a regular polygonal shape. As illustrated in FIG. 4, the amount of deformation is largest at a center portion of the membrane portion Mb and the amount of deformation is smallest at an edge portion of the membrane portion Mb.

FIG. 5 is a graph illustrating the results of simulation analysis of the relationship between the depth of the recess and the amount of deformation of a membrane portion having a circular shape. In FIG. 5, the vertical axis represents the amount of deformation (μm) of the membrane portion and the horizontal axis represents the depth (μm) of the recess. As example simulation analysis conditions, the thickness of the membrane portion Mb was set to 500 nm, the radius of the membrane portion Mb was set to 100 μm, and the pressure inside the recess 113 was set to 0.5 Pa.

As illustrated in FIG. 5, the amount of deformation of the membrane portion Mb was approximately constant even when the depth of the recess 113 was varied from 5 μm to 70 μm.

Figure 6:
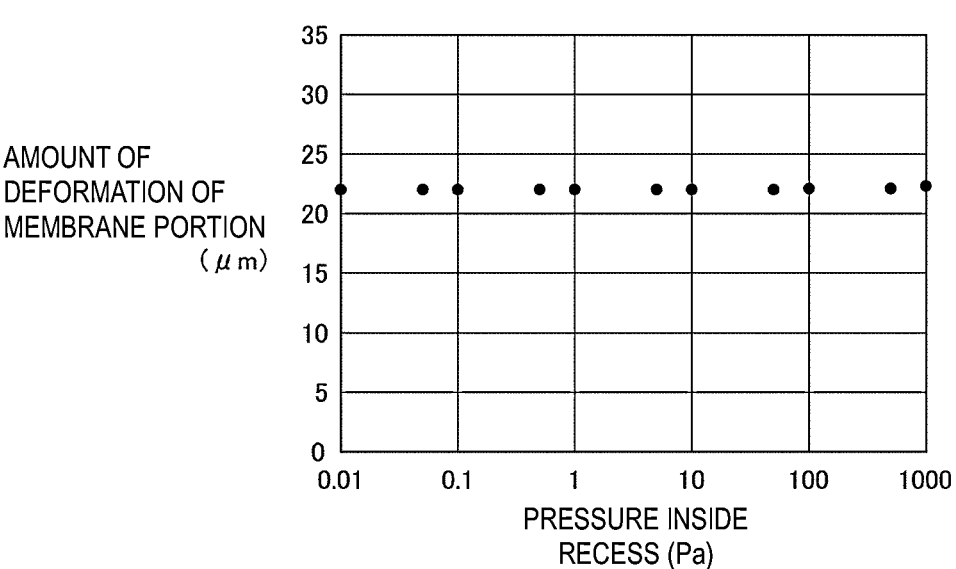
FIG. 6 is a graph illustrating the results of simulation analysis of the relationship between the pressure inside the recess and the amount of deformation of the membrane portion having a circular shape.

FIG. 6 is a graph illustrating the results of simulation analysis of the relationship between the pressure inside the recess and the amount of deformation of a membrane portion having a circular shape. In FIG. 6, the vertical axis represents the amount of deformation (μm) of the membrane portion and the horizontal axis represents the pressure (Pa) inside the recess. As example simulation analysis conditions, the thickness of the membrane portion Mb was set to 500 nm, the radius of the membrane portion Mb was set to 100 μm, and the depth of the recess 113 was set to 70 μm.

As illustrated in FIG. 6, the amount of deformation of the membrane portion Mb remained approximately constant even when the pressure inside the recess 113 was varied from 0.01 Pa to 1000 Pa.

Figure 7:
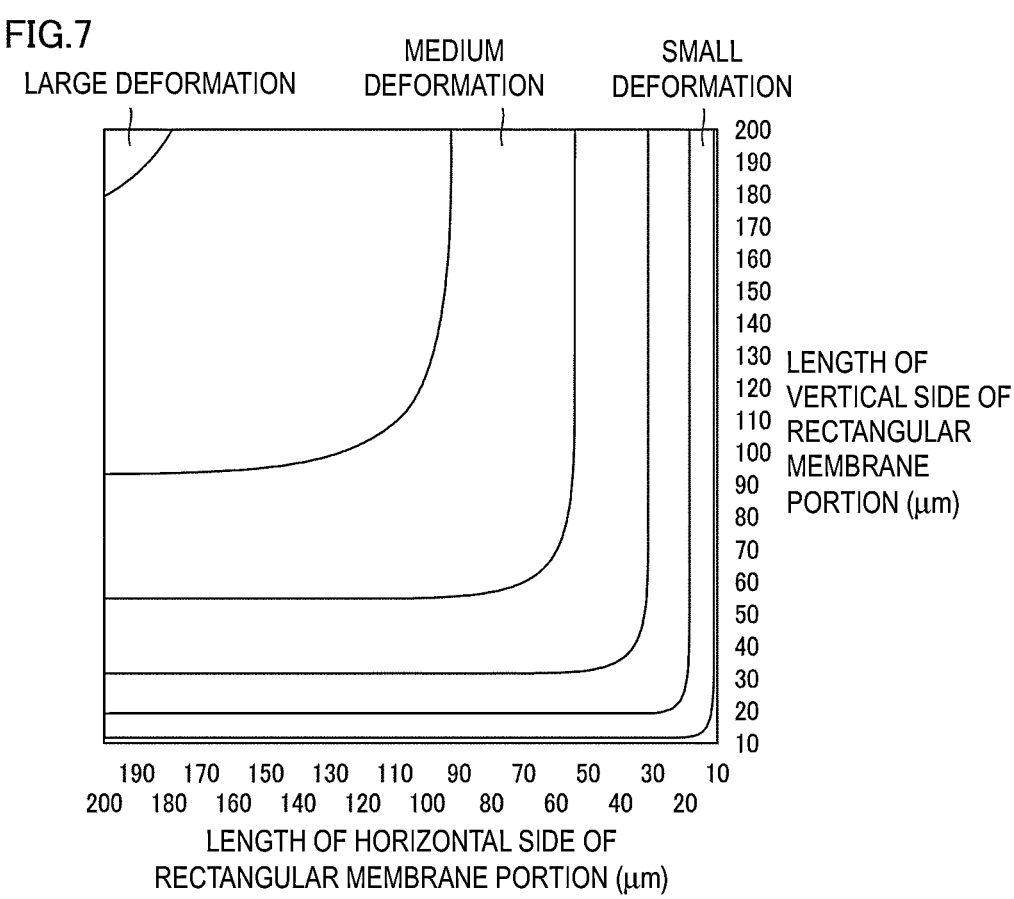
FIG. 7 is a graph illustrating the results of simulation analysis of the relationship between the lengths of the vertical and horizontal sides of a rectangular membrane portion and the amount of deformation of the membrane portion.

FIG. 7 is a graph illustrating the results of simulation analysis of the relationship between the lengths of the vertical and horizontal sides of a membrane portion having a rectangular shape and the amount of deformation of the membrane portion. In FIG. 7, the vertical axis represents the length (μm) of the vertical sides of the rectangular membrane portion Mb, the horizontal axis represents the length (μm) of the horizontal sides of the rectangular membrane portion Mb, and contour lines representing the amount of deformation of the membrane portion Mb are illustrated. As example simulation analysis conditions, the thickness of the membrane portion Mb was set to 400 nm, the depth of the recess 113 was set to 50 μm, and the pressure inside the recess 113 was set to 0.5 Pa.

As illustrated in FIG. 7, in a small deformation region where the amount of deformation of the membrane portion Mb is 80 nm or less, the amount of deformation of the membrane portion Mb was determined by the length of the shorter sides out of the vertical and horizontal sides of the rectangular membrane portion Mb. That is, the amount of deformation of the membrane portion Mb was determined by the length of the shorter sides among the sides of the rectangular membrane portion Mb.

Figure 8:
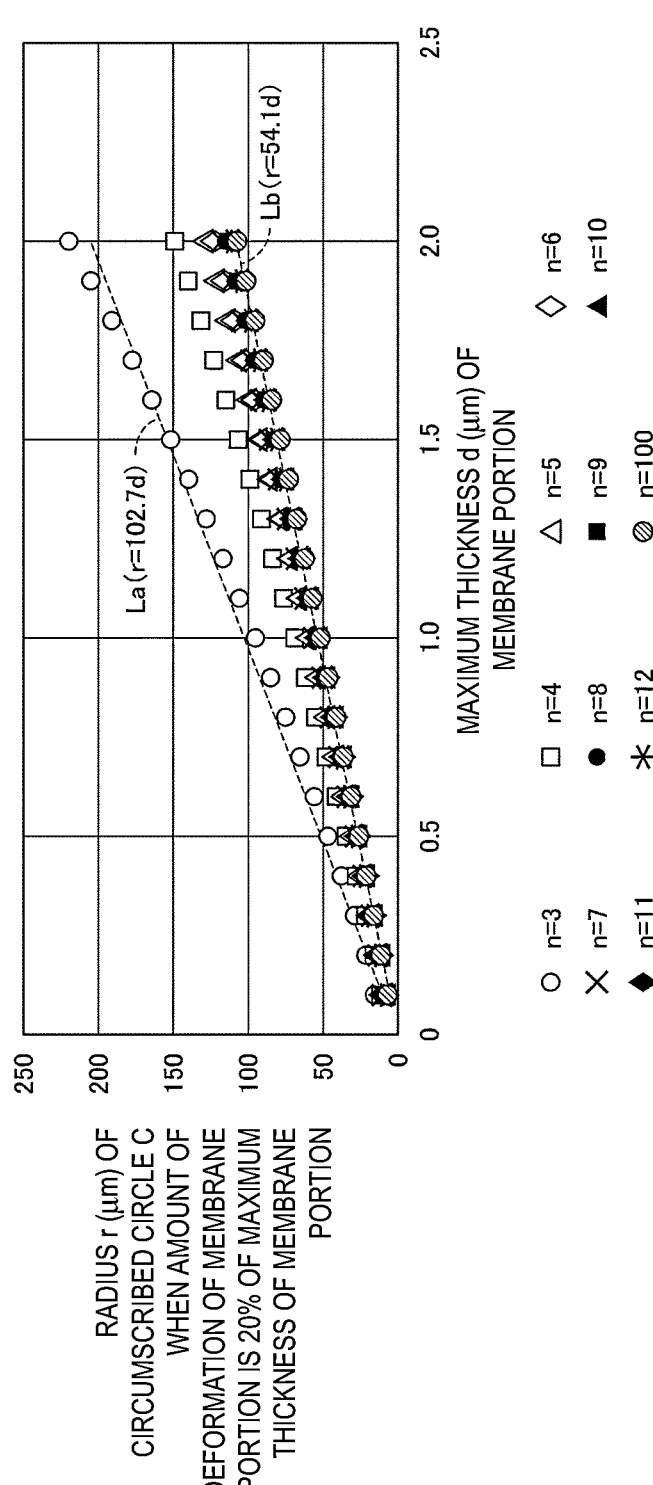
FIG. 8 is a graph illustrating the results of simulation analysis of the relationship between a radius r of a circumscribed circle C when the amount of deformation of the membrane portion having a polygonal shape is about 20% of the maximum thickness of the membrane portion, a maximum thickness d of the membrane portion, and the number of sides of the polygonal shape.

FIG. 8 is a graph illustrating the results of example simulation analysis of the relationship between the radius r of the circumscribed circle C when the amount of deformation of the membrane portion having a polygonal shape is about 20% of the maximum thickness of the membrane portion, the maximum thickness d of the membrane portion, and the number of sides of the polygonal shape. In FIG. 8, the vertical axis represents the radius r (μm) of the circumscribed circle C when the amount of deformation of the membrane portion is about 20% of the maximum thickness of the membrane portion and the horizontal axis represents the maximum thickness d (μm) of the membrane portion. As example simulation analysis conditions, the depth of the recess 113 was set to 50 μm and the pressure inside the recess 113 was set to 0.5 Pa. When the amount of deformation of the membrane portion Mb is about 20% or less of the maximum thickness d of the membrane portion Mb, degradation of the characteristics of the piezoelectric device 100 is reduced or prevented.

As illustrated in FIG. 8, the correlation between the radius r (μm) of the circumscribed circle C when the amount of deformation of the membrane portion Mb is about 20% of the maximum thickness of the membrane portion Mb, and the maximum thickness d (μm) of the membrane portion can be approximated as a straight line for each number n of a plurality of sides of the polygonal shape. For an approximation straight line La for when n=3, the relationship r=102.7 d is satisfied, and for an approximation straight line Lb for when n=12, the relationship r=54.1 d is satisfied. When n=100, the shape of the membrane portion Mb has a substantially circular shape.

Figure 9:
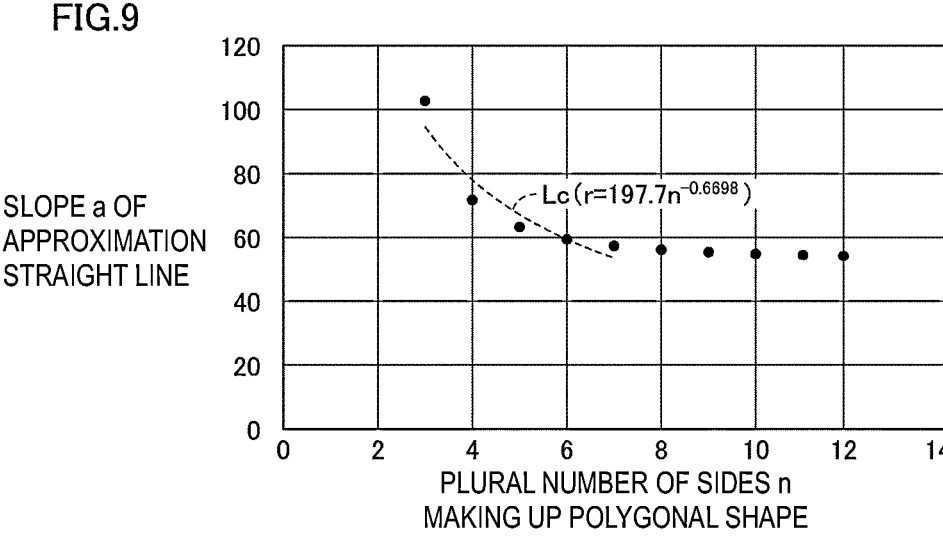
FIG. 9 is a graph illustrating the relationship between the number n of a plurality of sides of a polygonal shape and a slope a of an approximation straight line based on the correlations illustrated in FIG. 8.

FIG. 9 is a graph illustrating the relationship between the number n of a plurality of sides of the polygonal shape and a slope a of an approximation straight line based on the correlations illustrated in FIG. 8. In FIG. 9, the vertical axis represents the slope a of an approximation straight line and the horizontal axis represents the number n of a plurality of sides of the polygonal shape.

As illustrated in FIG. 9, when 3≤n≤7, the relationship between the number n of a plurality of sides of the polygonal shape and the slope a of an approximation straight line can be approximated by a curve. Specifically, when 3≤n≤7, the relationship a=197.7n−0.6698 was satisfied by an approximation curve Lc. When 8≤n, a converged to 52.69.

In other words, when 3≤n≤7, the amount of deformation of the membrane portion Mb can be kept to about 20% or less of the maximum thickness d of the membrane portion Mb and consequently degradation of the characteristics of the piezoelectric device 100 can be reduced or prevented by satisfying r≤197.7 dn$^{-0.6698}$.

When 8≤n, the amount of deformation of the membrane portion Mb can be kept to about 20% or less of the maximum thickness d of the membrane portion Mb and consequently the degradation of the characteristics of the piezoelectric device 100 can be reduced or prevented by satisfying r≤52.69. When the membrane portion Mb has a circular shape, the amount of deformation of the membrane portion Mb can be kept to about 20% or less of the maximum thickness d of the membrane portion Mb and consequently degradation of the characteristics of the piezoelectric device 100 can be reduced or prevented by satisfying r≤52.69 d.

Hereafter, an example method of manufacturing the piezoelectric device 100 according to Preferred Embodiment 1 of the present invention is described.

Figure 10:
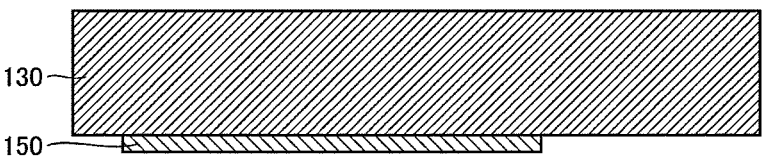
FIG. 10 is a cross-sectional view illustrating a state in which a lower electrode layer has been provided on the lower surface of a single-crystal piezoelectric layer in a method of manufacturing the piezoelectric device according to Preferred Embodiment 1 of the present invention.

FIG. 10 is a cross-sectional view illustrating a state in which the lower electrode layer has been provided on the lower surface of the single-crystal piezoelectric layer in the method of manufacturing the piezoelectric device according to Preferred Embodiment 1 of the present invention. The thickness of the single-crystal piezoelectric layer 130 at the time of formation is larger than the thickness of the single-crystal piezoelectric layer 130 ultimately contained in the piezoelectric device 100 according to this preferred embodiment.

As illustrated in FIG. 10, the lower electrode layer 150 is provided on the lower surface of the single-crystal piezoelectric layer 130 by using a lift-off method, a plating method, or an etching method.

Figure 11:
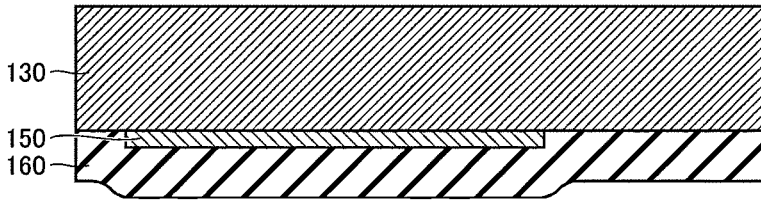
FIG. 11 is a cross-sectional view illustrating a state in which an intermediate layer has been provided on the lower surfaces of a lower electrode layer and a single-crystal piezoelectric layer in the method of manufacturing the piezoelectric device according to Preferred Embodiment 1 of the present invention.

FIG. 11 is a cross-sectional view illustrating a state in which the intermediate layer has been provided on the lower surfaces of the lower electrode layer and the single-crystal piezoelectric layer in the method of manufacturing the piezoelectric device according to Preferred Embodiment 1 of the present invention. As illustrated in FIG. 11, the intermediate layer 160 is provided on the lower surfaces of the lower electrode layer 150 and the single-crystal piezoelectric layer 130 using a chemical vapor deposition (CVD) method or a physical vapor deposition (PVD) method.

Figure 12:
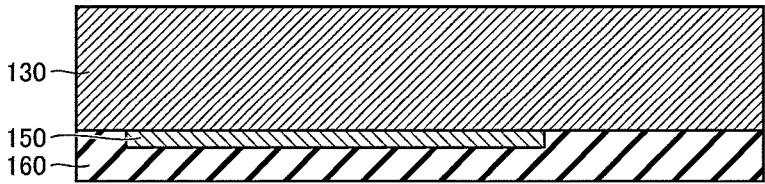
FIG. 12 is a cross-sectional view illustrating a state in which the lower surface of the intermediate layer has been planarized in the method of manufacturing the piezoelectric device according to Preferred Embodiment 1 of the present invention.

FIG. 12 is a cross-sectional view illustrating a state in which the lower surface of the intermediate layer has been planarized in the method of manufacturing the piezoelectric device according to Preferred Embodiment 1 of the present invention. As illustrated in FIG. 12, the lower surface of the intermediate layer 160 is planarized using chemical mechanical polishing (CMP) or the like.

Figure 13:
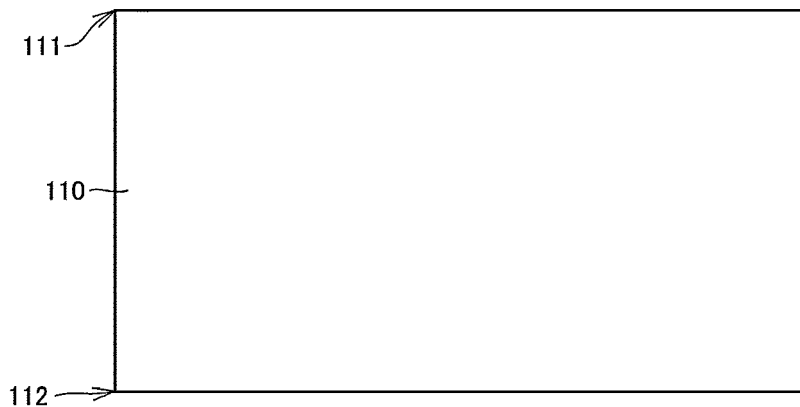
FIG. 13 is a cross-sectional view illustrating a state prior to a recess being formed in a base portion in the method of manufacturing the piezoelectric device according to Preferred Embodiment 1 of the present invention.
Figure 14:
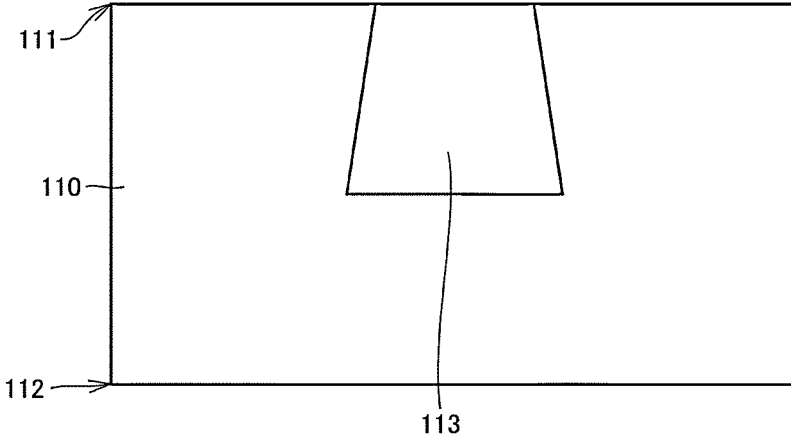
FIG. 14 is a cross-sectional view illustrating a state in which a recess has been formed in the base portion in the method of manufacturing the piezoelectric device according to Preferred Embodiment 1 of the present invention.

FIG. 13 is a cross-sectional view illustrating a state prior to formation of a recess in the base portion in the method of manufacturing the piezoelectric device according to Preferred Embodiment 1 of the present invention. FIG. 14 is a cross-sectional view illustrating a state in which the recess has been formed in the base portion in the method of manufacturing the piezoelectric device according to Preferred Embodiment 1 of the present invention.

As illustrated in FIGS. 13 and 14, the recess 113 is formed in the base portion 110 using deep reactive ion etching (DRIE) or another method from the one main surface 111 side of the base portion 110.

Figure 15:
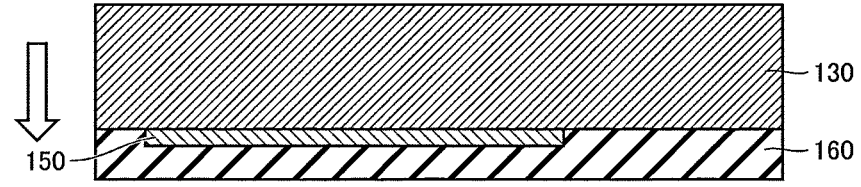
FIG. 15 is a cross-sectional view illustrating a state in which the base portion has been bonded to the plurality of layers illustrated in FIG. 12 in the method of manufacturing the piezoelectric device according to Preferred Embodiment 1 of the present invention.
Figure 15:
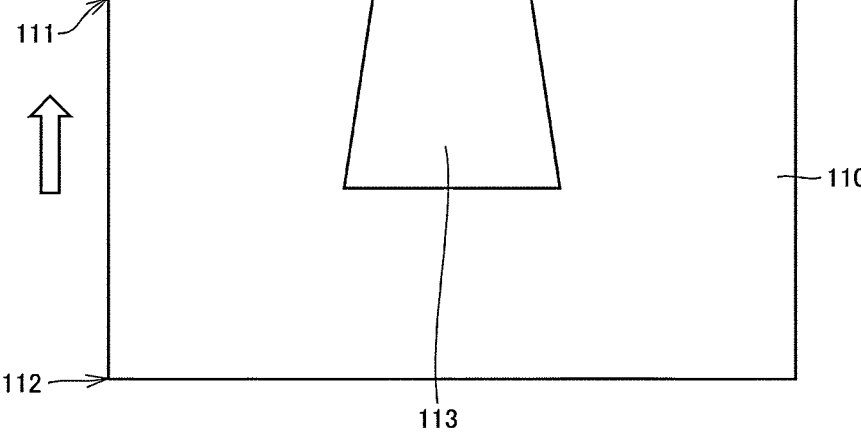
Figure 16:
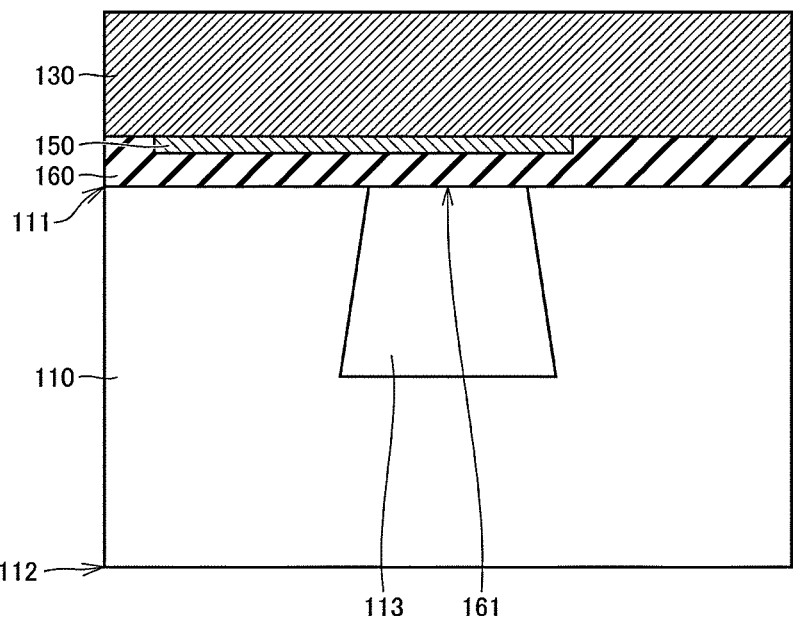
FIG. 16 is a cross-sectional view illustrating a state in which the base portion has been bonded to the lower surface of the intermediate layer in the method of manufacturing the piezoelectric device according to Preferred Embodiment 1 of the present invention.

FIG. 15 is a cross-sectional view illustrating a state in which the base portion is bonded to the plurality of layers illustrated in FIG. 12 in the method of manufacturing the piezoelectric device according to Preferred Embodiment 1 of the present invention. FIG. 16 is a cross-sectional view illustrating a state in which the base portion has been bonded to the lower surface of the intermediate layer in the method of manufacturing the piezoelectric device according to Preferred Embodiment 1 of the present invention.

As illustrated in FIGS. 15 and 16, the one main surface 111 of the base portion 110 is bonded to the lower surface 161 of the intermediate layer 160 using surface activated bonding, atomic diffusion bonding, or another method. As a result, the inside of the recess 113 becomes a sealed space.

In this preferred embodiment, the intermediate layer 160 and the base portion 110 are bonded together under vacuum pressure in order help reduce or prevent entry of foreign matter into the inside of the recess 113. In this case, "vacuum pressure" may refer to a low vacuum, a medium vacuum, a high vacuum, or an ultrahigh vacuum. Since the intermediate layer 160 and the base portion 110 are bonded together in this manner, the pressure inside the recess 113 is a negative pressure. Furthermore, since the pressure inside the recess 113 is a negative pressure, the lower surface 161 of the intermediate layer 160 above the recess 113 curves in a convex manner towards the other main surface 112.

The atmosphere in which the intermediate layer 160 and the base portion 110 are bonded to each other is not limited to a vacuum pressure. The intermediate layer 160 may be bonded to the base portion 110 under atmospheric pressure or may be bonded to the base portion 110 under a pressure higher than atmospheric pressure. As a result of bonding the intermediate layer 160 and the base portion 110 to each other under any of these atmospheres, the lower surface 161 of the intermediate layer 160 may be flat or may curve in a convex manner towards the opposite side from the other main surface 112.

Figure 17:
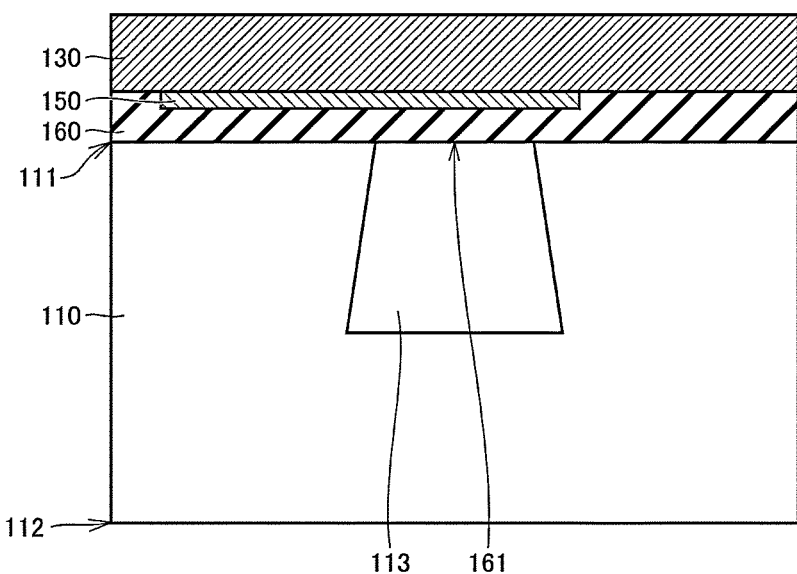
FIG. 17 is a cross-sectional view illustrating a state in which the upper surface of the single-crystal piezoelectric layer has been shaved down in the method of manufacturing the piezoelectric device according to Preferred Embodiment 1 of the present invention.

FIG. 17 is a cross-sectional view illustrating a state in which the upper surface of the single-crystal piezoelectric layer has been shaved down in the method of manufacturing the piezoelectric device according to Preferred Embodiment 1 of the present invention. As illustrated in FIG. 17, the upper surface of the single-crystal piezoelectric layer 130 is shaved down using CMP or another method in order to give the single-crystal piezoelectric layer 130 the desired thickness. In this case, the thickness of the single-crystal piezoelectric layer 130 is adjusted so that the desired amount of expansion and contraction of the single-crystal piezoelectric layer 130 with the application of a voltage is obtained. As the thickness of the single-crystal piezoelectric layer 130 decreases, the more curved the lower surface 161 of the intermediate layer 160 becomes.

A release layer may be formed on the upper surface side of the single-crystal piezoelectric layer 130 in advance using ion implantation. In this case, the thickness of the single-crystal piezoelectric layer 130 can be easily adjusted by peeling off the release layer prior to shaving down the upper surface of the single-crystal piezoelectric layer 130 using CMP or another method.

Figure 18:
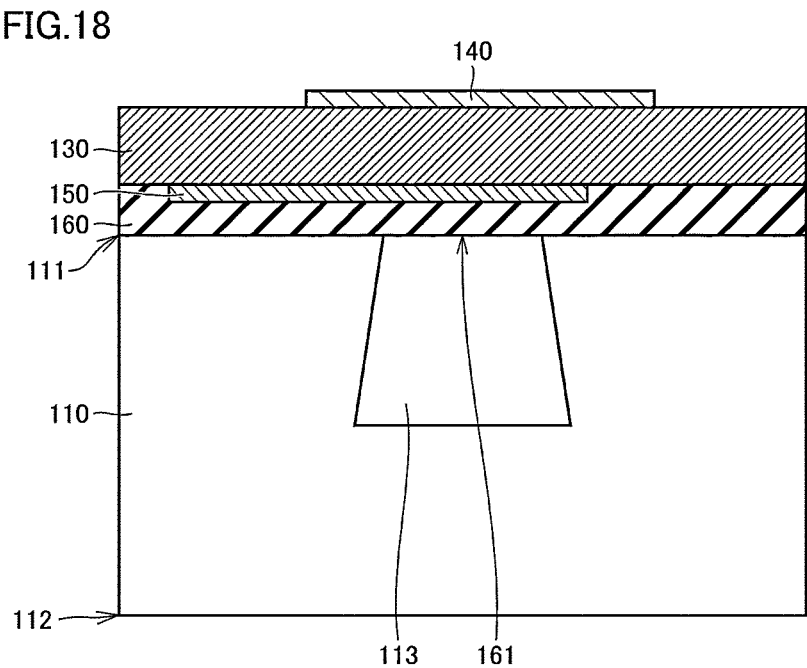
FIG. 18 is a cross-sectional view illustrating a state in which an upper electrode layer has been provided on the upper surface of the single-crystal piezoelectric layer in the method of manufacturing piezoelectric device according to Preferred Embodiment 1 of the present invention.

FIG. 18 is a cross-sectional view illustrating a state in which the upper electrode layer has been provided on the upper surface of the single-crystal piezoelectric layer in the method of manufacturing the piezoelectric device according to Preferred Embodiment 1 of the present invention. As illustrated in FIG. 18, the upper electrode layer 140 is provided on a portion of the upper surface of the single-crystal piezoelectric layer 130 using a lift-off method, a plating method, an etching method, or another method. In this way, the multilayer portion 120 is stacked on the one main surface 111 side of the base portion 110. Since the intermediate layer 160 and the base portion 110 are bonded together under vacuum pressure, the multilayer portion 120 curves in a convex manner towards the other main surface 112 side above the recess 113.

Finally, the hole 131 is provided in a portion of the upper surface of the single-crystal piezoelectric layer 130 using a lift-off method, a plating method, an etching method, or another method.

Through the above-described processes, the piezoelectric device 100 according to Preferred Embodiment 1 of the present invention, as illustrated in FIG. 2, is manufactured.

As described above, in the piezoelectric device 100 according to this preferred embodiment, the outer shape of the recess 113 is a polygonal shape or a circular shape when viewed in a direction perpendicular to the one main surface 111. Looking in a direction perpendicular to the one main surface 111, when n represents the number of a plurality of sides of the polygonal shape, which is the outer shape of the recess 113, r represents the radius of the circumscribed circle C of an imaginary regular polygonal shape including n sides having the length L1 identical to that of the shortest side out of the plurality of sides, and d represents the maximum thickness of the membrane portion Mb, which is located above the recess 113, in the multilayer portion 120, $r \leq 197.7 \, dn^{-0.6698}$ is satisfied when $3 \leq n \leq 7$, and $r \leq 52.69 \, d$ is satisfied when $8 \leq n$ or when the outer shape of the recess 113 is a circular shape.

As a result, the amount of deformation of the membrane portion Mb can be kept to about 20% or less of the maximum thickness d of the membrane portion Mb and consequently degradation of the characteristics of the piezoelectric device 100 can be reduced or prevented. In other words, degradation of the characteristics of the piezoelectric device 100 due to the curvature of the single-crystal piezoelectric layer 130 or non-uniform thickness of the single-crystal piezoelectric layer 130 can be reduced or prevented.

In the piezoelectric device 100 according to this preferred embodiment, the outer shape of the recess 113 is a rectangular shape when viewed in a direction perpendicular to the one main surface 111, and as a result, degradation of the characteristics of the piezoelectric device 100 can be reduced or prevented by only adjusting the length L1 of the short sides among the sides of the rectangular shape.

In the piezoelectric device 100 according to this preferred embodiment, even when the single-crystal piezoelectric layer 130 curves towards the base portion 110 in a convex manner due to the negative pressure inside the recess 113, deformation of the membrane portion Mb can be kept to about 20% or less of the maximum thickness d of the membrane portion Mb and degradation of the characteristics of the piezoelectric device 100 can be reduced or prevented as a result of the membrane portion Mb satisfying the above relationship between the radius r of the circumscribed circle C and the maximum thickness d of the membrane portion Mb.

When the pressure inside the recess 113 is positive, the membrane portion Mb curves in the opposite direction. However, as a result of the membrane portion Mb satisfying the above relationship between the radius r of the circumscribed circle C and the maximum thickness d of the membrane portion Mb, the amount of deformation of the membrane portion Mb is kept to about 20% or less of the maximum thickness d of the membrane portion Mb and degradation of the characteristics of the piezoelectric device 100 can be reduced or prevented.

Naturally, even if the pressure inside the recess 113 is the same as the pressure outside the piezoelectric device 100, the membrane portion Mb satisfies the above relationship between the radius r of the circumscribed circle C and the maximum thickness d of the membrane portion Mb, and as a result, the amount of deformation of the membrane portion Mb is kept to about 20% or less of the maximum thickness d of the membrane portion Mb and degradation of the characteristics of the piezoelectric device 100 can be reduced or prevented.

In the piezoelectric device 100 according to this preferred embodiment, the intermediate layer 160 is stacked so as to cover the lower electrode layer 150 from below. This helps to prevent degradation of the lower electrode layer 150 because the lower surface of the lower electrode layer 150 is not exposed to the outside or the recess 113.

In the piezoelectric device 100 according to this preferred embodiment, the lower surface 161 of the intermediate layer 160 is flat in regions not located above the recess 113. This allows the intermediate layer 160 and the base portion 110 to closely contact each other, thereby enabling the occurrence of peeling off between the intermediate layer 160 and the base portion 110 to be prevented.

In the piezoelectric device 100 according to this preferred embodiment, the inside of the recess 113 is sealed in order to help prevent foreign matter from entering the inside of the recess 113.

Hereafter, modifications of the piezoelectric device 100 according to Preferred Embodiment 1 of the present invention are described.

Figure 19:
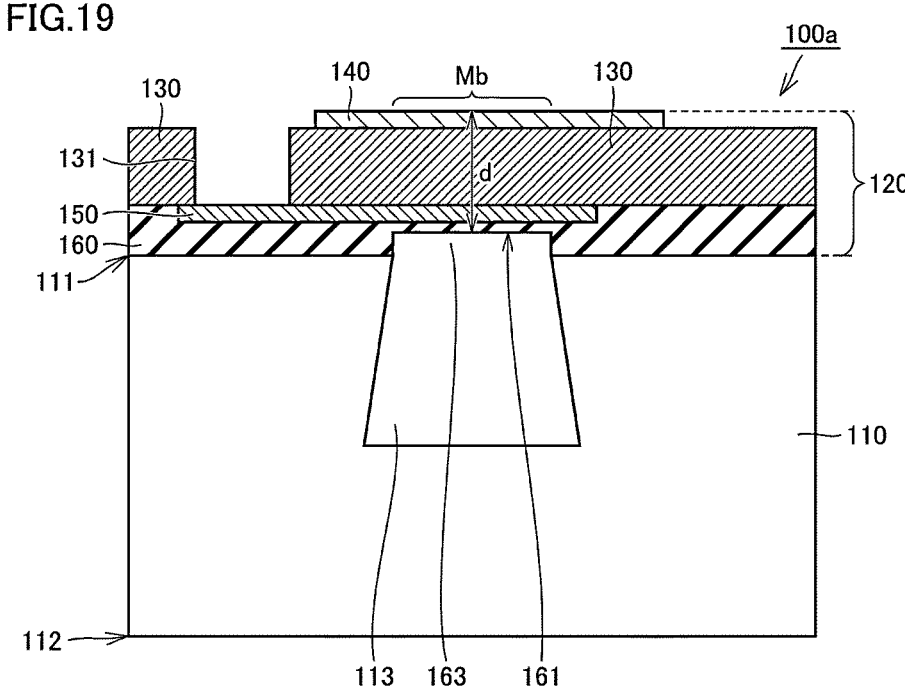
FIG. 19 is a cross-sectional view illustrating the configuration of a piezoelectric device according to a First Modification of Preferred Embodiment 1 of the present invention.

FIG. 19 is a cross-sectional view illustrating the configuration of a piezoelectric device according to a First Modification of Preferred Embodiment 1 of the present invention. The same cross-sectional view as in FIG. 2 is illustrated in FIG. 19. As illustrated in FIG. 19, in a piezoelectric device 100*a* according to the First Modification of Preferred Embodiment 1 of the present invention, a recess 163 that is connected to the recess 113 is formed in the intermediate layer 160. The bottom surface of the recess 163 defines a portion of the lower surface 161 of the intermediate layer 160.

In the First Modification, the maximum thickness d of the membrane portion Mb is the maximum thickness between the upper surface of the upper electrode layer 140 and the bottom surface of the recess 163 in a direction perpendicular to the one main surface 111 in a portion located above the recess 113.

Figure 20:
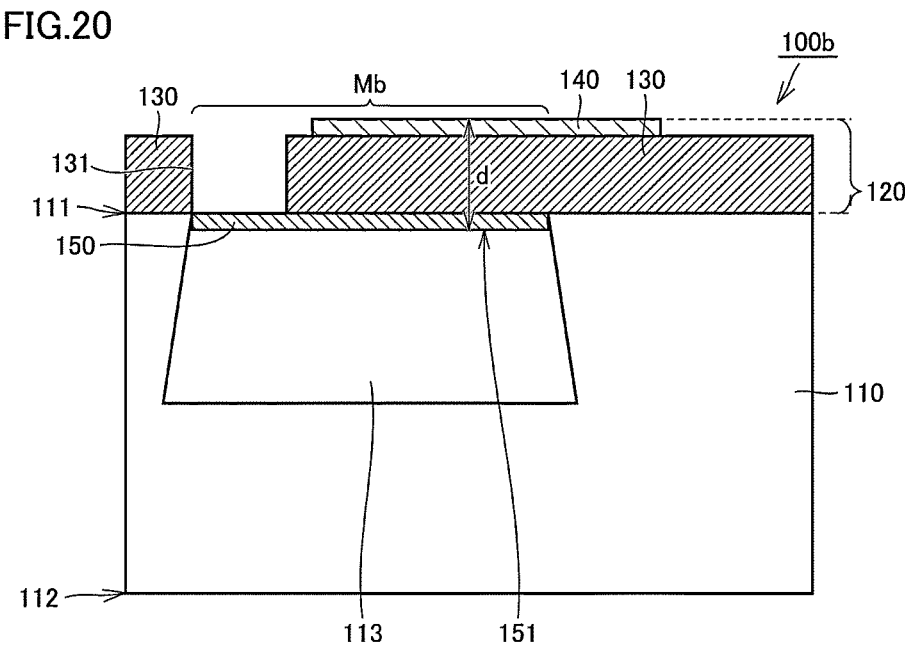
FIG. 20 is a cross-sectional view illustrating the configuration of a piezoelectric device according to a Second Modification of Preferred Embodiment 1 of the present invention.

FIG. 20 is a cross-sectional view illustrating the configuration of a piezoelectric device according to a Second Modification of Preferred Embodiment 1 of the present invention. The same cross-sectional view as in FIG. 2 is illustrated in FIG. 20. As illustrated in FIG. 20, in a piezoelectric device 100*b* according to the Second Modification of Preferred Embodiment 1 of the present invention, the intermediate layer 160 is not provided. The lower electrode layer 150 is disposed inside the recess 113.

In the Second Modification, the maximum thickness d of the membrane portion Mb is the maximum thickness between the upper surface of the upper electrode layer 140 and a lower surface 151 of the lower electrode layer 150 in a direction perpendicular to the one main surface 111 in the portion located above the recess 113.

Figure 21:
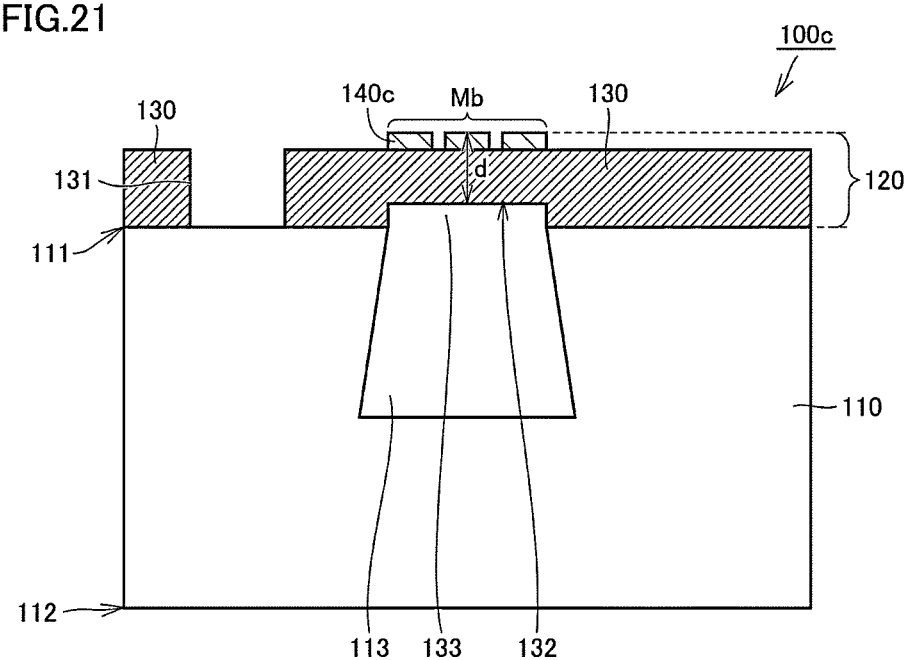
FIG. 21 is a cross-sectional view illustrating the configuration of a piezoelectric device according to a Third Modification of Preferred Embodiment 1 of the present invention.

FIG. 21 is a cross-sectional view illustrating the configuration of a piezoelectric device according to a Third Modification of Preferred Embodiment 1 of the present invention. The same cross-sectional view as in FIG. 2 is illustrated in FIG. 21. As illustrated in FIG. 21, in a piezoelectric device 100*c* according to the Third Modification of Preferred Embodiment 1 of the present invention, the intermediate layer 160 and the lower electrode layer 150 are not provided. An upper electrode layer 140*c* includes a pair of electrode layers that are positioned so as to be spaced apart from each other and between which a voltage is applied. A recess 133, which communicates with the recess 113, is formed in the single-crystal piezoelectric layer 130. The bottom surface of the recess 133 defines a portion of a lower surface 132 of the single-crystal piezoelectric layer 130.

In the Third Modification, the maximum thickness d of the membrane portion Mb is the maximum thickness between the upper surface of the upper electrode layer 140*c* and the bottom surface of the recess 133 in a direction perpendicular to the one main surface 111 in a portion located above the recess 113.

Figure 22:
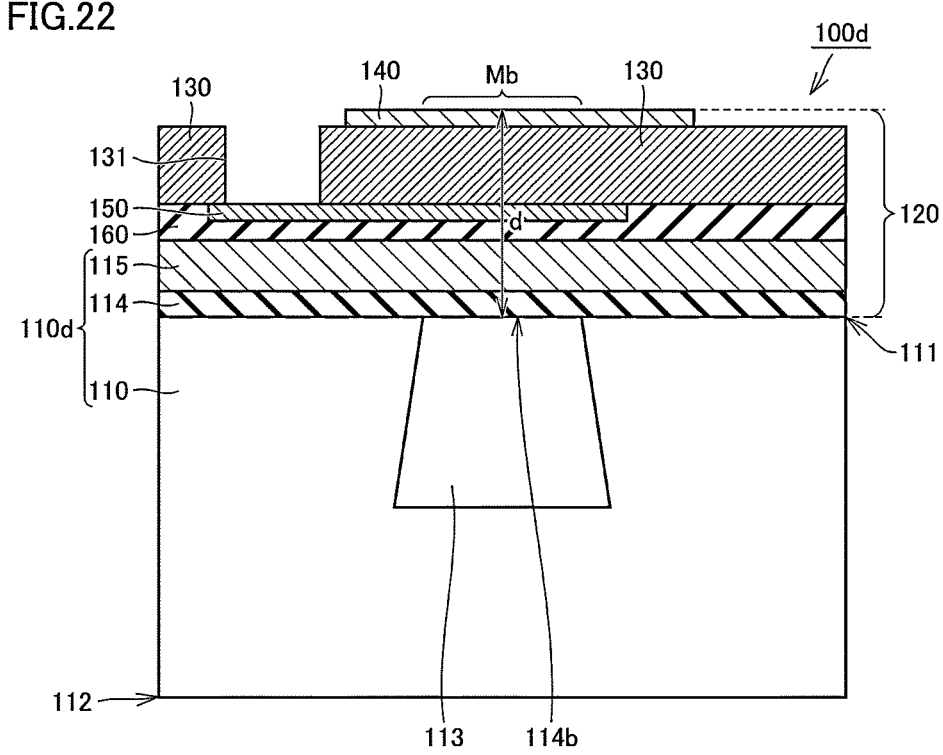
FIG. 22 is a cross-sectional view illustrating the configuration of a piezoelectric device of a Fourth Modification of Preferred Embodiment 1 of the present invention.

FIG. 22 is a cross-sectional view illustrating the configuration of a piezoelectric device according to a Fourth Modification of Preferred Embodiment 1 of the present invention. The same cross-sectional view as in FIG. 2 is illustrated in FIG. 22. As illustrated in FIG. 22, in a piezoelectric device 100*d* according to a Fourth Modification of Preferred Embodiment 1 of the present invention, a $SiO_2$ layer 114 and a Si layer 115 are provided between the base portion 110 and the intermediate layer 160. The base portion 110, the $SiO_2$ layer 114 and the Si layer 115 define a so-called silicon on insulator (SOI) substrate.

In the Fourth Modification, the maximum thickness d of the membrane portion Mb is the maximum thickness between the upper surface of the upper electrode layer 140 and a lower surface 114*b* of the $SiO_2$ layer 114 in a direction perpendicular to the one main surface 111 in a portion located above the recess 113.

Preferred Embodiment 2

Hereafter, a piezoelectric device according to Preferred Embodiment 2 of the present invention is described while referring to the drawings. The piezoelectric device according to Preferred Embodiment 2 of the present invention mainly differs from the piezoelectric device 100 according to Preferred Embodiment 1 of the present invention in that the base portion is provided with a hole that penetrates from the bottom of the recess to the other main surface of the base portion, and therefore description of the elements and features of the configuration that are the same as in the piezoelectric device 100 according to Preferred Embodiment 1 of the present invention is not repeated.

Figure 23:
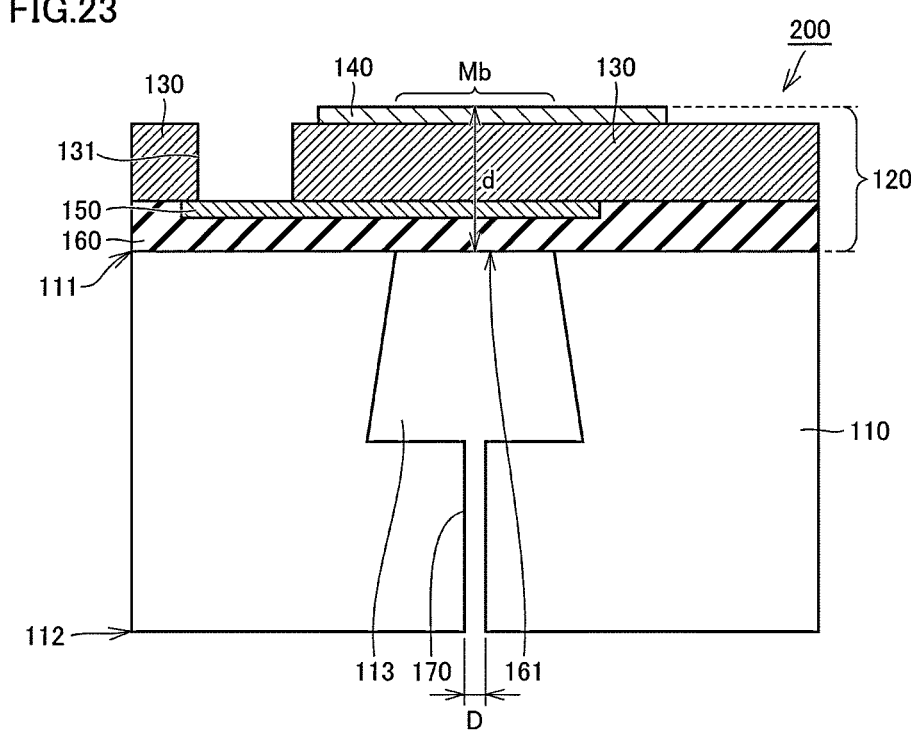
FIG. 23 is a cross-sectional view illustrating the configuration of a piezoelectric device according to Preferred Embodiment 2 of the present invention.

FIG. 23 is a cross-sectional view illustrating the configuration of the piezoelectric device according to Preferred Embodiment 2 of the present invention. The same cross-sectional view is illustrated in FIG. 23 as in FIG. 2. As illustrated in FIG. 23, in a piezoelectric device 200 according to Preferred Embodiment 2 of the present invention, the base portion 110 is provided with a hole 170 that penetrates from the bottom of the recess 113 to the other main surface 112. The area of the hole 170 is smaller than the area of the membrane portion Mb when viewed in a direction perpendicular to one main surface 111. A diameter D of the hole 170 is about 140 μm or less when viewed in a direction perpendicular to the one main surface 111, for example. The hole 170 can be formed using DRIE or another method.

In the piezoelectric device 200 according to Preferred Embodiment 2 of the present invention, the base portion 110 is provided with the hole 170 that penetrates from the bottom of the recess 113 to the other main surface 112. This allows the pressure inside the recess 113 to be made equal to the pressure outside the piezoelectric device 200, and as a result, the amount of deformation due to the curvature of the membrane portion Mb can be reduced compared to when the pressure inside the recess 113 is a negative pressure.

In the piezoelectric device 200 according to Preferred Embodiment 2 of the present invention, the area of the hole 170 is smaller than the area of the membrane portion Mb when viewed in a direction perpendicular to the one main surface 111. This helps prevent the rigidity of the base portion 110 from being significantly reduced due to the hole 170 being provided.

In the piezoelectric device 200 according to Preferred Embodiment 2 of the present invention, the diameter D of the hole 170 is about 140 μm or less when viewed in a direction perpendicular to the one main surface 111, for example. This helps prevent water or foreign matter from entering the recess 113 through the hole 170 from outside the piezoelectric device 200.

Configurations in the above description of the preferred embodiments that can be combined with each other may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a base portion including one main surface and another main surface located on an opposite side from the one main surface, and including a recess in the one main surface; and
   a multilayer portion stacked on a side of the base portion where the one main surface is located so as to cover the recess from above; wherein
   the multilayer portion includes, at least above the recess, a single-crystal piezoelectric layer and a pair of electrode layers through which a voltage is applied to the single-crystal piezoelectric layer;
   the single-crystal piezoelectric layer curves convexly in the direction perpendicular to the one main surface towards the base portion above the recess;
   an outer shape of the recess is a polygonal shape or a circular shape when viewed in a direction perpendicular to the one main surface; and
   when n represents a number of a plurality of sides of the polygonal shape, r represents a radius of a circumscribed circle of an imaginary regular polygon including n sides with a length identical to a length of a shortest side among the plurality of sides, and d represents a maximum thickness of a membrane portion, which is located above the recess, of the multilayer portion:
   $r \leq 197.7 \, dn^{-0.6698}$ is satisfied when $3 \leq n \leq 7$; and
   $r \leq 52.69 \, d$ is satisfied when $8 \leq n$ or when the outer shape of the recess is a circular shape.

2. The piezoelectric device according to claim 1, wherein the outer shape of the recess is rectangular or substantially rectangular.

3. The piezoelectric device according to claim 1, wherein the base portion is provided with a hole that penetrates from a bottom of the recess to the other main surface; and
   a diameter of the hole is about 140 μm or less when viewed in a direction perpendicular to the one main surface.

4. The piezoelectric device according to claim 1, wherein a pressure inside the recess is a negative pressure.

5. The piezoelectric device according to claim 1, wherein a width of an opening of the recess is smaller than a width of a bottom portion of the recess.

6. The piezoelectric device according to claim 1, wherein a width of an opening of the recess is equal to a width of a bottom portion of the recess.

7. The piezoelectric device according to claim 1, wherein a width of an opening of the recess is larger than a width of a bottom portion of the recess.

8. The piezoelectric device according to claim 1, wherein an inside of the recess is sealed.

9. The piezoelectric device according to claim 1, wherein a pressure inside the recess is atmospheric pressure.

10. The piezoelectric device according to claim 1, wherein a pressure inside the recess is a positive pressure.

11. The piezoelectric device according to claim 1, wherein the base portion includes silicon.

12. The piezoelectric device according to claim 1, wherein the single-crystal piezoelectric layer is flat at portions not above the recess.

13. The piezoelectric device according to claim 1, wherein a hole extends vertically through the single-crystal piezoelectric layer.

14. The piezoelectric device according to claim 13, wherein the hole is above the one main surface of the base portion and not above the recess.

15. The piezoelectric device according to claim 1, wherein the single-crystal piezoelectric layer includes lithium tantalate or lithium niobate.

16. The piezoelectric device according to claim 15, wherein the single-crystal piezoelectric layer has a uniform polarization state.

17. The piezoelectric device according to claim 1, wherein the multilayer portion curves convexly towards the other main surface above the recess.

18. The piezoelectric device according to claim 1, further comprising an intermediate layer including a lower surface located above the recess and curving convexly towards the other main surface.

19. The piezoelectric device according to claim 18, wherein the intermediate layer includes $SiO_2$.

20. A piezoelectric device comprising:
   a base portion including one main surface and another main surface located on an opposite side from the one main surface, and including a recess in the one main surface; and
   a multilayer portion stacked on a side of the base portion where the one main surface is located so as to cover the recess from above; wherein
   the multilayer portion includes, at least above the recess, a single-crystal piezoelectric layer and a pair of electrode layers through which a voltage is applied to the single-crystal piezoelectric layer;
   the multilayer portion curves convexly in the direction perpendicular to the one main surface towards the other main surface above the recess;
   an outer shape of the recess is a polygonal shape or a circular shape when viewed in a direction perpendicular to the one main surface; and
   when n represents a number of a plurality of sides of the polygonal shape, r represents a radius of a circumscribed circle of an imaginary regular polygon including n sides with a length identical to a length of a shortest side among the plurality of sides, and d represents a maximum thickness of a membrane portion, which is located above the recess, of the multilayer portion:
   $r \leq 197.7 \, dn^{-0.6698}$ is satisfied when $3 \leq n \leq 7$; and
   $r \leq 52.69 \, d$ is satisfied when $8 \leq n$ or when the outer shape of the recess is a circular shape.

* * * * *